United States Patent [19]

Botto et al.

[11] Patent Number: 5,604,772
[45] Date of Patent: Feb. 18, 1997

[54] TRANSMISSION SYSTEM AND MODEM UTILIZING CODED MODULATION

[75] Inventors: Jean-Luc Botto, Montrouge; Didier Lepitre, Paris, both of France

[73] Assignee: U.S. Philips Corporation, New York, N.Y.

[21] Appl. No.: 614,294

[22] Filed: Mar. 12, 1996

Related U.S. Application Data

[63] Continuation of Ser. No. 304,107, Sep. 9, 1994.

[30] Foreign Application Priority Data

Sep. 13, 1993 [FR] France .................................. 93 10865

[51] Int. Cl.$^6$ .................................................. H04L 27/38
[52] U.S. Cl. .............................. 375/341; 375/265; 371/34
[58] Field of Search ....................... 375/262, 265, 375/340, 341; 371/43

[56] References Cited

U.S. PATENT DOCUMENTS 4,709,377 11/1987 Martinez et al. ...................... 375/262

OTHER PUBLICATIONS

"The Viterbi Algorithm", by G. David Forney, Jr., Proc. of the IEEE, vol. 61, No. 3, Mar. 1973.

Primary Examiner—Stephen Chin
Assistant Examiner—Kevin Kim
Attorney, Agent, or Firm—Anne E. Barschall

[57] ABSTRACT

The transmission system and the modem according to the invention use trellis-coded modulation based on a constellation split up into N sub-sets. For each received symbol in this constellation a decision arrangement makes it possible to determine the combination of the N points closest to the received symbol in each of the N sub-sets. Therefore, the constellation is split up into zones corresponding each to a given combination, and the arrangement comprises a zone searching module (2) in which any received point is situated. This module then controls the reading of a Table (3) which gives a combination of points which combination corresponds to this zone.

20 Claims, 4 Drawing Sheets ically operates at higher bit rates, such as 14400 bits/s, for example.

TRANSMISSION SYSTEM AND MODEM UTILIZING CODED MODULATION

This is a continuation of application Ser. No. 08/304,107, filed on Sep. 9, 1994.

BACKGROUND OF THE INVENTION

The present invention relates to a transmission system utilizing trellis-coded modulation based on a constellation split up into N sub-sets, and comprising a data source and a data receiver which itself comprises a decision arrangement which arrangement makes it possible to determine the closest point to a received symbol in each sub-set of the constellation by assigning to the received symbol a combination of N points.

The invention likewise relates to a modem comprising such a decision arrangement.

Currently, trellis coding is widely used in the-field of digital modulation. It consists of splitting up the constellation into sub-sets which are selected so that the minimum square euclidian distance separating two points of a same sub-set is maximized. It is thus possible to divide the constellation several times to obtain the desired distance.

Thus, for transmitting Q data bits, P redundancy bits are added while a constellation of $2^{Q+P}$ points is used (in practice P is generally fixed at 1): M of the Q data bits are thus utilized by a convolutional coder having a ratio M/M+P (which corresponds to the addition of P redundancy bits) to indicate one of the $2^{M+P}$ sub-sets of the constellation; and the Q–M remaining bits are used to determine, in an indicated sub-set, one Of the $2^{Q-M}$ points.

The behaviour of a convolutional coder is described by a trellis of which each branch represents the transition from one state to another of the convolutional coder by the transmission of a point of a given sub-set of the constellation.

The Viterbi algorithm is known to be an optimum decoding method for these convolutional codes. Its principle is described in the article "*The Viterbi Algorithm*" by G. David Forney, published 3 March 1973 in "Proceedings of the IEEE". It may simply be recollected that the first stage of this algorithm consists of determining for each received symbol the symbol which is closest thereto in the sense of the euclidian distance, in each sub-set of the constellation.

Therefore, it is known that for each of the sub-sets of the constellation the distances separating the received symbol from each of the points of the sub-set under consideration are calculated, after which the symbol of the sub-set that corresponds to the minimum distance is selected.

This method makes it necessary to make a large number of calculations directly proportional to the size of the constellation used. For example, if one goes from a transmission rate of 12000 bits/s (which corresponds to a constellation of 8 sub-sets of. 8 points) to a rate of 14400 bits/s (which corresponds to a constellation of 8 sub-sets of 16 points), the number of calculations is doubled. Thus, for high transmission rates the number of calculations to be made rises considerably. Moreover, the symbol corresponding to the minimum distance is to be searched as many times as there are sub-sets.

SUMMARY OF THE INVENTION

It is an object of the invention to propose a transmission system for coded modulation, comprising a receiver whose decision arrangement does not present these drawbacks.

Therefore, a transmission system according to the invention and that described in the opening paragraph is characterized in that, whilst the constellation is split up into zones corresponding each to a given combination of N points, said decision arrangement comprises a searching module for searching the zone in which the received symbol is situated, and a Table which provides, when read, the combination corresponding to this zone.

Thus, the decision arrangement of a receiver of a transmission system according to the invention does not use any distance calculation. Only the zone of the complex plane containing the received symbol is searched, and the Table needs to be read only once to determine the combination of N points assigned to the received symbol.

In a preferred embodiment the zone searching module determines the searched zone by dichotomy with respect to the boundaries of the various zones. And, advantageously, the zones used are straight lines.

Only several tests are thus necessary to determine the sought zone.

In a further advantageous embodiment, to simplify its implementation, a decision arrangement of a receiver of a transmission system according to the invention comprises a preprocessing module which makes it possible to restore by symmetry any received point in one of the four quadrants of the plane selected as a reference plane to perform the searching operation there and called reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

It is a further object of the invention to propose a modem utilizing said modulation, which comprises a decision arrangement which itself comprises a searching module for searching a zone in which the received symbol is situated, and a Table which provides, when read, the combination that corresponds to this zone.

Other particularities, details and advantages of the invention will be made evident by the description which is to follow, given with reference to the annexed drawings, which are giver by way of non-limiting example.

DETAILED DESCRIPTION OF THE INVENTION

Figure 1:
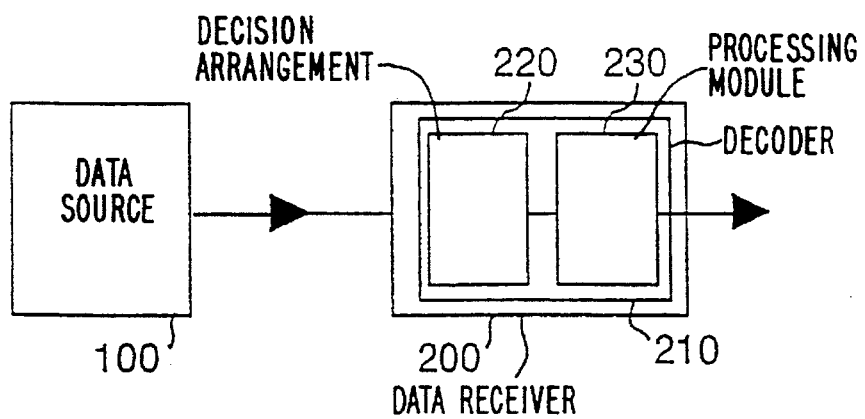
FIG. 1 represents in a diagram a transmission system according to the invention.

In the rest of the description a bit rate of 9600 bits/s is considered to make the exposition not too complex. However, one should bear in mind that said decision arrangement is all the more advantageous as the number of points of the
FIG. 1 shows in a diagram a transmission system according to the constellation is higher, that is to say, that the bit rate is important. invention, in which trellis-coded modulation is used based on a constellation split up into N sub-sets. Such a system comprises a data source 100 and a data receiver 200. This data receiver comprises, more specifically, a decoder 210 intended to decode said modulation, this decoder itself comprising a decision arrangement 220. The data coming from the decision arrangement 220 are applied to a processing module 230 which performs the conventional processing of a Viterbi decoder and thus need not be described here. The output data of the decoder 210 are supplied to a user.

Figure 2:
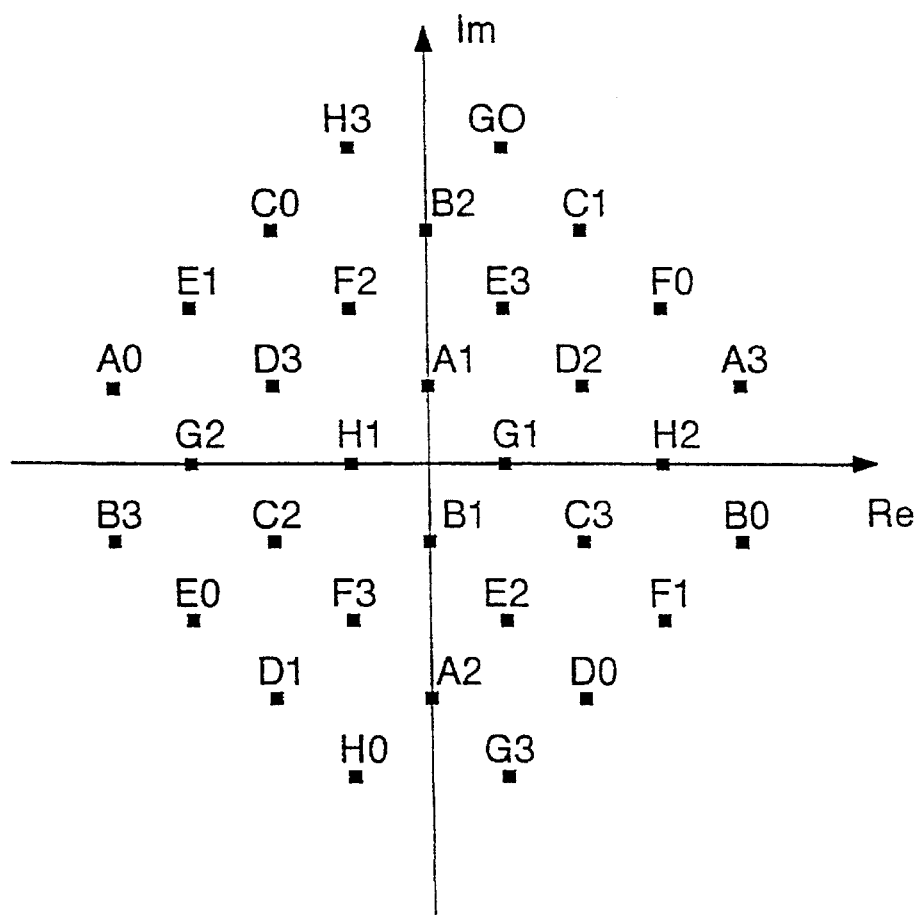
FIG. 2 represents the constellation used in Recommendation V32/V32bis for trellis-coded modulation at 9600 bits/s.

FIG. 2 represents the constellation used by Recommendation V32/V32bis for trellis-coded modulation at 9600 bits/s.

This constellation comprises 32 points split up into eight sub-sets of four points each. These sub-sets are referenced by the letters A to H and in each of them the points are numbered from 0 to 3. To each point of the constellation is assigned a binary word Y0, Y1, Y2, Q3, Q4, the bits Y0, Y1 and Y2 on the one hand, and Q3 and Q4, on the other, being used for coding the sub-set and the point in this sub-set, respectively. The Tables 1 and 2 to be given below indicate the correspondence between the references used in the FIGS. (A0 to H3) and the binary words fixed by Recommendation V32bis.

TABLE 1

| sub-set | $Y_0$ | $Y_1$ | $Y_2$ |
|---|---|---|---|
| A | 0 | 0 | 0 |
| B | 0 | 0 | 1 |
| C | 0 | 1 | 0 |
| D | 0 | 1 | 1 |
| E | 1 | 0 | 0 |
| F | 1 | 0 | 1 |
| G | 1 | 1 | 0 |
| H | 1 | 1 | 1 |

TABLE 2

| point | $Q_3$ | $Q_4$ |
|---|---|---|
| 0 | 0 | 0 |
| 1 | 1 | 0 |
| 2 | 0 | 1 |
| 3 | 1 | 1 |

Figure 3:
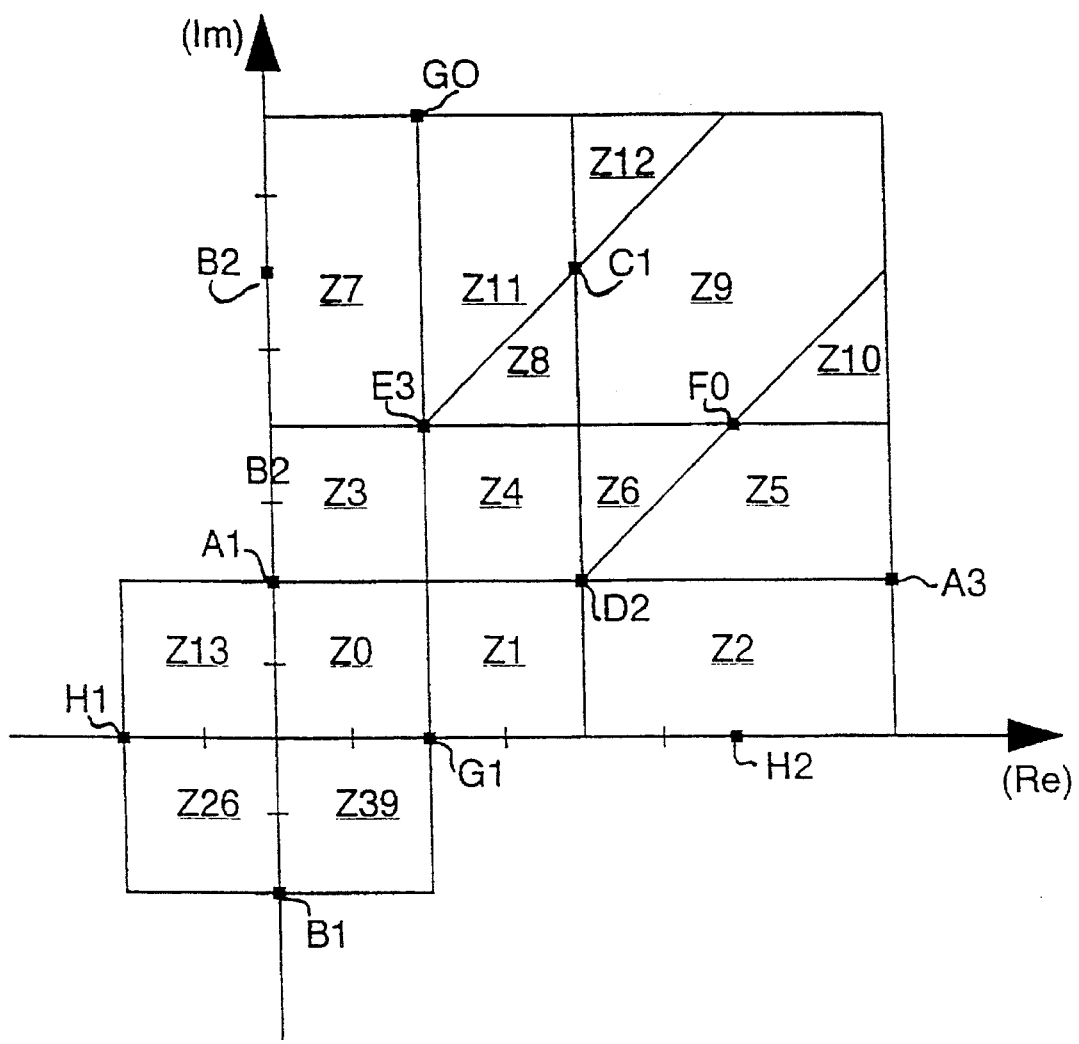
FIG. 3 represents an example of how a quadrant of the plane of this same constellation is split up into zones.

FIG. 3 represents the splitting up into thirteen zones of the quadrant (X>0, Y>0) used as a reference for the calculation of the zone searching. The thirteen zones have been defined, by calculating for a large number of received points lying very close together, the euclidian distances which separate these points from all the points of the constellation, to determine the combination of the eight closest points assigned to each of them. Each zone is then formed by the set of the received points for which a like combination has been determined. These zones are numbered Z0 to Z12.

The numbers of the zones of the quadrants (X<0, Y>0), (X<0, Y<0) and (X>0, Y<0) are obtained by adding respectively +13, +26 and +39 to the numbers of the zones of the reference quadrant of which they are the symmetrical value along the real axis (Re) and the imaginary axis (Ira) of the complex plane. Thus, the zone of the quadrant (X<0, Y>0) which is symmetrical with the zone Z0 along the imaginary axis is numbered Z13; the zone of the quadrant (X<0, Y<0) which is symmetrical with the zone Z0 relative to the origin is numbered Z26 and, finally, the zone of the quadrant (X>0, Y<0) which is symmetrical with the zone Z0 along the real axis is numbered Z39. With this numbering it is possible to obtain easily, based upon a number of a zone calculated in the reference quadrant, the number of another zone which is symmetrical therewith in another quadrant.

Table 3 shows the combinations of eight points obtained for each zone of each quadrant.

Figure 4:
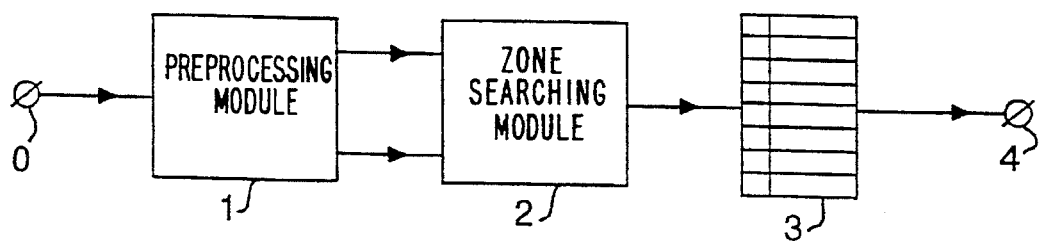
FIG. 4 is a diagram of an embodiment for the decision arrangement of a receiver of a transmission system according to the invention.

According to FIG. 4 a decision arrangement of a receiver of a transmission system according to the invention comprises a preprocessing module 1 connected to an input 0 which produces the coordinates of a received point, and a zone searching module 2 which controls the reading of a Table 3 which contains the combinations of eight points assigned to each zone of tile constellation. These sixteen bits resulting from such a reading are supplied to an output 4.

The input of preprocessing module 1 has coordinates Xr and Yr of the received point R. The module 1 locates this received point R in one of the four quadrants of the complex plane by testing these coordinates Xr and Yr relative to the origin (0,0). In the case where the quadrant obtained is different from the reference quadrant (X>0, Y>0), the received point R is restored there by symmetry as a function of the imaginary and/or real axes of the complex plane (Xr becomes —Xr and/or Yr becomes —Yr). A new point R' having coordinates Xr' and Yr' is then obtained.

The initial quadrant of the received point R is then stored via a variable index in the following manner:

if R is in the first quadrant (Xr>0, Yr>0): index=0, if R is in the second quadrant (Xr<0, Yr>0): index=13, if R is in the third quadrant (Xr<0, Yr<0): index=26, if R is in the fourth quadrant (Xr>0, Yr<0): index=39.

The coordinates Xr' and Yr' of the point R and the variable index are transmitted to the zone searching module 2.

TABLE 3

| 1st quadrant | | | | | | | | |
|---|---|---|---|---|---|---|---|---|
| zone 0 | A1 | B1 | C3 | D2 | E3 | F2 | G1 | H1 |
| 1 | A1 | B1 | C3 | D2 | E3 | F0 | G1 | H2 |
| 2 | A3 | B0 | C3 | D2 | E3 | F0 | G1 | H2 |
| 3 | A1 | B2 | C1 | D2 | E3 | F2 | G1 | H1 |
| 4 | A1 | B2 | C1 | D2 | E3 | F0 | G1 | H2 |
| 5 | A3 | B0 | C1 | D2 | E3 | F0 | G1 | H2 |
| 6 | A3 | B2 | C1 | D2 | E3 | F0 | G1 | H2 |
| 7 | A1 | B2 | C1 | D2 | E3 | F2 | G0 | H3 |
| 8 | A1 | B2 | C1 | D2 | E3 | F0 | G0 | H2 |
| 9 | A3 | B2 | C1 | D2 | E3 | F0 | G0 | H2 |
| 10 | A3 | B0 | C1 | D2 | E3 | F0 | G0 | H2 |
| 11 | A1 | B2 | C1 | D2 | E3 | F0 | G0 | H3 |
| 12 | A3 | B2 | C1 | D2 | E3 | F0 | G0 | H3 |
| 2nd quadrant | | | | | | | | |
| zone 13 | A1 | B1 | C2 | D3 | E3 | F2 | G1 | H1 |
| 14 | A1 | B1 | C2 | D3 | E1 | F2 | G2 | H1 |
| 15 | A0 | B3 | C2 | D3 | E1 | F2 | G2 | H1 |
| 16 | A1 | B2 | C0 | D3 | E3 | F2 | G1 | H1 |
| 17 | A1 | B2 | C0 | D3 | E1 | F2 | G2 | H1 |
| 18 | A0 | B3 | C0 | D3 | E1 | F2 | G2 | H1 |
| 19 | A0 | B2 | C0 | D3 | E1 | F2 | G2 | H1 |
| 20 | A1 | B2 | C0 | D3 | E3 | F2 | G0 | H3 |
| 21 | A1 | B2 | C0 | D3 | E1 | F2 | G2 | H3 |
| 22 | A0 | B2 | C0 | D3 | E1 | F2 | G2 | H3 |
| 23 | A0 | B3 | C0 | D3 | E1 | F2 | G2 | H3 |
| 24 | A1 | B2 | C0 | D3 | E1 | F2 | G0 | H3 |
| 25 | A0 | B2 | C0 | D3 | E1 | F2 | G0 | H3 |
| 3rd quadrant | | | | | | | | |
| zone 26 | A1 | B1 | C2 | D3 | E2 | F3 | G1 | H1 |

TABLE 3-continued

| | A | B | C | D | E | F | G | H |
|---|---|---|---|---|---|---|---|---|
| 27 | A1 | B1 | C2 | D3 | E0 | F3 | G2 | H1 |
| 28 | A0 | B3 | C2 | D3 | E0 | F3 | G2 | H1 |
| 29 | A2 | B1 | C2 | D1 | E2 | F3 | G1 | H1 |
| 30 | A2 | B1 | C2 | D1 | E0 | F3 | G2 | H1 |
| 31 | A0 | B3 | C2 | D1 | E0 | F3 | G2 | H1 |
| 32 | A2 | B3 | C2 | D1 | E0 | F3 | G2 | H1 |
| 33 | A2 | B1 | C2 | D1 | E2 | F3 | G3 | H0 |
| 34 | A2 | B1 | C2 | D1 | E0 | F3 | G2 | H0 |
| 35 | A2 | B3 | C2 | D1 | E0 | F3 | G2 | H0 |
| 36 | A0 | B3 | C2 | D1 | E0 | F3 | G2 | H0 |
| 37 | A2 | B1 | C2 | D1 | E0 | F3 | G3 | H0 |
| 38 | A2 | B3 | C2 | D1 | E0 | F3 | G3 | H0 |

4th quadrant

| | A | B | C | D | E | F | G | H |
|---|---|---|---|---|---|---|---|---|
| zone 39 | A1 | B1 | C3 | D2 | E2 | F3 | G1 | H1 |
| 40 | A1 | B1 | C3 | D2 | E2 | F1 | G1 | H2 |
| 41 | A3 | B0 | C3 | D2 | E2 | F1 | G1 | H2 |
| 42 | A2 | B1 | C3 | D0 | E2 | F3 | G1 | H1 |
| 43 | A2 | B1 | C3 | D0 | E2 | F1 | G1 | H2 |
| 44 | A3 | B0 | C3 | D0 | E2 | F1 | G1 | H2 |
| 45 | A2 | B0 | C3 | D0 | E2 | F1 | G1 | H2 |
| 46 | A2 | B1 | C3 | D0 | E2 | F3 | G3 | H0 |
| 47 | A2 | B1 | C3 | D0 | E2 | F1 | G3 | H2 |
| 48 | A2 | B0 | C3 | D0 | E2 | F1 | G3 | H2 |
| 49 | A3 | B0 | C3 | D0 | E2 | F1 | G3 | H2 |
| 50 | A2 | B1 | C3 | D0 | E2 | F1 | G3 | H0 |
| 51 | A2 | B0 | C3 | D0 | E2 | F1 | G3 | H0 |

Figure 5:
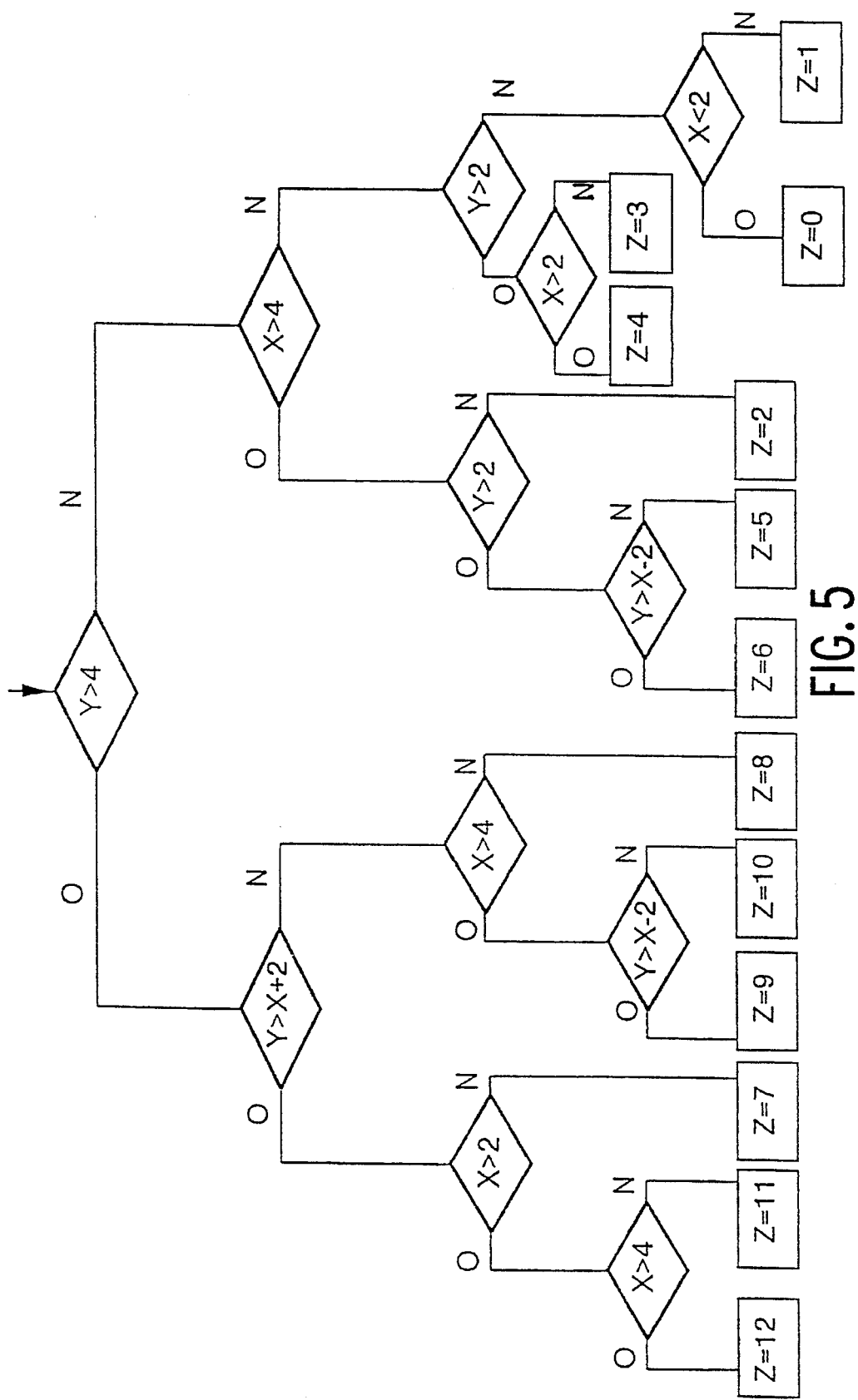
FIG. 5 represents the flow chart Of an embodiment for the zone searching algorithm.

This zone searching module 2 determines the zone of the reference quadrant to which point R' belongs by dichotomy according to an algorithm shown in FIG. 5, for example. Other equivalent algorithms can also be used.

Each step of the algorithm consists of making a test with the coordinates Xr' and Yr' of the point R to position the point on one side or other of the equation lines Y=4, Y=X+2, X=2, X=4, Y=2 and Y=X−2 which form the boundaries bounding the various zones in the complex plane. When the number of the zone containing the point R' is determined, module 2 adds it to the variable index to obtain the number Zr of the zone of the initial quadrant which contains the received point R. Module 2 then controls the reading of the line Zr from the Table 3 which thus supplies on the output 4 the 16 bits which relate to eight points of the constellation which are closest to point R. For example, the received point R belongs to zone Z0, line 0 of the Table gives 16 bits formed by the two bits Q3 and Q4 of the eight points belonging to the sub-sets A to H i.e. A1, B1, C3, D2, E3, F2, G1 and H1, respectively. They are the 16 bits which are supplied on the output of said decision arrangement.

The module 2 for searching a zone by dichotomy thus utilizes four simple tests in the worst case, which means, whilst taking the test of the initial quadrant made by the preprocessing module 1 into consideration, that only five tests and a single reading of the Table are necessary to determine the eight points which are closest to the received point R. For a higher transmission rate, and thus for a more widely used constellation, only several additional tests will be necessary. For example, when the transmission rate doubles, it will be sufficient to perform an additional test.

In a particularly advantageous embodiment said decision arrangement is formed by a microprocessor unit 11 comprising an actual microprocessor 12, a random-access memory 13 and a read-only memory 14 which contains instructions necessary for implementing the invention.

Particularly the high-rate modems which utilize trellis-coded modulation advantageously comprise a decision arrangement as described above.

Figure 6:
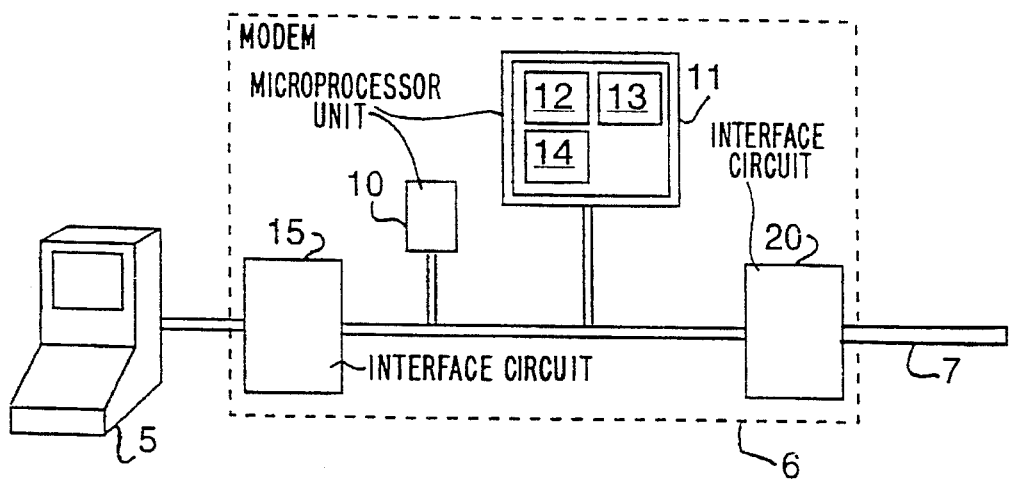
FIG. 6 represents a modem according to the invention.

According to FIG. 6 a modem according to the invention, which is referenced 6, makes it possible to connect a digital terminal 5 to a telephone-line type transmission line 7. This modem comprises microprocessor units 10 and 11, a first interface circuit 15 which allows of connection of this modem to terminal 5, and a second interface circuit 20 which allows of transforming the signals coming from the telephone line 7 into digital signals and vice versa. The interface circuit 20 is described in European Patent Specification No. 0 318 105.

The microprocessor unit 10 is assigned to the management of the modem and unit 11, ensuring the transmission operations, comprises a microprocessor 12, a random-access memory 13 and a read-only memory 14 which contains furthermore the instructions which make it possible to utilize said decision arrangement.

Thus it is possible to realise a modem according to the invention having a rate of, for example, 19200 bits/s, with a calculation load that is slightly higher than that of a prior-art modem with 14400 bits/s in accordance with Recommendation V32bis, which makes it possible to retain the same architecture: only the read-only memory 14 is to be replaced to change, for example, from a modem having a rate of 14400 bits/s according to the prior art to a modem having a rate of 19200 bits/s according to the invention. This is a particularly important advantage from a commercial point of view.

Needless to observe that modifications may be applied to the embodiment which has just been described, more specifically, by substituting means of equivalent technology, without leaving the scope of the present invention.

We claim:

1. Transmission system utilizing trellis-coded modulation based on a constellation split up into N sub-sets, and comprising a data source and a data receiver which itself comprises a decision arrangement which arrangement makes it possible to determine the closest points to a received symbol in each sub-set of the constellation by assigning to the received symbol a combination of N closest points, wherein whilst the constellation is split up into zones corresponding each to a given combination of N closest points each zone having one point from each subset, said decision arrangement comprises a searching module for searching for the zone in which the received symbol is situated, and a Table which provides, when read using the zone as an index, the combination of N closest points corresponding to this zone.

2. Transmission system utilizing trellis-coded modulation based on a constellation split up into N sub-sets, and comprising a data source and a data receiver which itself comprises a decision arrangement which arrangement makes it possible to determine the closest points to a received symbol in each sub-set of the constellation by assigning to the received symbol a combination of N closest points, wherein whilst the constellation is split up into zones corresponding each to a given combination of N closest points each zone having one point from each subset, said desision arrangement comprises a searching module for searching for the zone in which the received symbol is situated, and a Table which provides, when read using the zone as an index, the combination of N closest points corresponding to this zone, the zone searching module determining the searched zone by dichotomy with respect to the boundaries of the various zones.

3. Transmission system as claimed in claim 2, wherein the boundaries of the various zones are straight lines.

4. Transmission system utilizing trellis-coded modulation based on a constellation split up into N sub-sets, and comprising a data source and a data receiver which itself comprises a decision arrangement which arrangement makes it possible to determine the closest point to a received symbol in each sub-set of the constellation b assigning to the received symbol a combination of N points, wherein whilst the constellation is split up into zones corresponding each to a given combination of N points, said decision arrangement comprises a searching module for searching the zone in which the received symbol is situated, and a Table which provides, when read, the combination corresponding to this zone, and wherein the decision arrangement comprises a preprocessing module which makes it possible to restore by symmetry any received point in one of the four quadrants of the plane, selected as a reference plane to perform the searching operation there and called a reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

5. Transmission system as claimed in claim 4, wherein the preprocessing module and the zone searching module and the Table are formed by a microprocessor unit.

6. Modem utilizing trellis-coded modulation based on a constellation split up into N sub-sets, and comprising a decision arrangement which makes it possible to determine the points closest to a received symbol in each sub-set of the constellation, assigning to the received symbol a combination of N closest points, wherein whilst the constellation is split up into zones corresponding each to a given combination of N closest points each zone having one point from each sub-set, said decision arrangement comprises a searching module for searching the zone in which the received symbol is situated, and a Table which provides, when read using the zone as an index, the combination of N closest points corresponding to this zone.

7. Modem as claimed in claim 6, wherein the zone searching module determines the searched zone by dichotomy with respect to the boundaries of the various zones.

8. Modem as claimed in claim 7, wherein the boundaries of the various zones are straight lines.

9. Modem utilizing trellis-coded modulation based on a constellation split up into N sub-sets, and comprising a decision arrangement which makes it possible to determine the point closest to a received symbol in each sub-set of the constellation, assigning to the received symbol a combination of N points, wherein whilst the constellation is split up into zones corresponding each to a given combination of N points, said decision arrangement comprises a searching module for searching the zone in which the received symbol is situated, and a Table which provides, when red, the combination corresponding to this zone and wherein said decision arrangement comprises a preprocessing module which makes it possible to restore by symmetry any received point in one of the four quadrants of the plane, selected as a reference plane to perform the searching operation there and called a reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

10. Modem as claimed in claim 9, wherein the preprocessing module and zone searching module and the Table are formed by a microprocessor unit.

11. Transmission system utilizing trellis-coded modulation based on a constellation split up into N sub-sets, and comprising a data source and a data receiver which itself comprises a decision arrangement which arrangement makes it possible to determine the closest point to a received symbol in each sub-set of the constellation by assigning to the received symbol a combination of N points wherein whilst the constellation is split up into zones corresponding each to a given combination of N points, said decision arrangement comprises a searching module for searching the zone in which the received symbol is situated, and a Table which provides, when read, the combination corresponding to this zone, wherein the zone searching module determines the searched zone by dichotomy with respect to the boundaries of the various zones, and wherein the decision arrangement comprises a preprocessing module which makes it possible to restore by symmetry and received point in one of the four quadrants of the plane, selected as a reference plane to perform the searching operation there and called a reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

12. Transmission system utilizing trellis-coded modulation based on a constellation split up into N sub-sets, and comprising a data source and a data receiver which itself comprises a decision arrangement which arrangement makes it possible to determine the closest point to a received symbol in each sub-set of the constellation by assigning to the received symbol a combination of N points wherein whilst the constellation is split up into zones corresponding each to a given combination of N points, said decision arrangement comprises a searching module for searching the zone in which the received symbol is situated, and a Table which provides, when read, the combination corresponding to this zone, wherein the zone searching module determines the searched zone by dichotomy with respect to the boundaries of the various zones, wherein the boundaries of the various zones are straight lines, and wherein the decision arrangement comprises a preprocessing module which makes it possible to restore by symmetry any received point in one of the four quadrants of the plane, selected as a reference plane to perform the searching operation there and a called reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

13. Transmission system as claimed in claim 11, wherein the preprocessing module and the zone searching module and the Table are formed by a microprocessor unit.

14. Transmission system as claimed in claim 12, wherein the preprocessing module (1) and the zone searching module and the Table are formed by a microprocessor unit.

15. Modem utilizing trellis-coded modulation based on a constellation split up into N sub-sets, and comprising a data source and a data receiver which itself comprises a decision arrangement which arrangement makes it possible to determine the closest point to a received symbol in each sub-set of the constellation by assigning to the received symbol a combination of N points wherein whilst the constellation is split up into zones corresponding each to a given combination of N points, said decision arrangement comprises a searching module for searching the zone in which the received symbol is situated, and a Table which provides, when read, the combination corresponding to this zone, wherein the zone searching module determines the searched zone by dichotomy with respect to the boundaries of the various zones, and wherein the boundaries of the various zones are straight lines, and wherein said decision arrangement comprises a preprocessing module which makes it possible to restore by symmetry any received point in one of the four quadrants of the plane, selected as a reference plane to perform the searching operation there and called reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

16. Modem utilizing trellis-coded modulation based on a constellation split up into N sub-sets, and comprising a data source and a data receiver which itself comprises a decision arrangement which arrangement makes it possible to determine the closest point to a received symbol in each sub-set of the constellation b assigning to the received symbol a combination of N points wherein whilst the constellation is split up into zones corresponding each to a given combination of N points, said decision arrangement comprises a searching module for searching the zone in which the received symbol is situated, and a Table which provides, when read, the combination corresponding to this zone, wherein the zone searching module determines the searched zone by dichotomy with respect to the boundaries of the various zones, wherein the boundaries of the various zones are straight lines, and wherein wherein said decision arrangement comprises a preprocessing module which makes it possible to restore by symmetry any received point in one of the four quadrants of the plane, selected as a reference plane to perform the searching operation there and called reference quadrant, and in that the numbers of the zones in each of the quadrants are selected such that a mathematical operation called "addition of a constant" makes it possible to go from the number of the zone obtained in the reference quadrant to the numbers of the zones which are symmetrical with that zone along the axes of the plane of the constellation in the other quadrants.

17. Modem as claimed in claim 15, wherein the preprocessing module and zone searching module and the Table are formed by a microprocessor unit.

18. Modem as claimed in claim 16, wherein the preprocessing module and zone searching module and the Table are formed by a microprocessor unit.

19. A transmission system utilizing trellis-coded modulation, comprising:

a data source sending data; and a data receiver receiving the data as a received symbol and comprising:

a trellis point table including a constellation of points, the constellation being divided into N sub-sets, the constellation being divided into zones of points, each of the zones including N closest points to a corresponding one of plural receivable symbols and including one point in each sub-set; and a searching module determining a zone of the received symbol with the zone being used as an index to access the table and read the N closest points.

20. A method, comprising:

dividing trellis points into N sub-sets and into zones, each zone including N points closest to a receivable symbol and including one point in each sub-set;

storing the zones of points in a table;

receiving a received symbol and identifying the zone corresponding to the received symbol; and accessing the table with the identified zone being used as an index and reading out the N closest points to the received symbol.

* * * * *